(12) United States Patent
Xu

(10) Patent No.: US 12,278,644 B2
(45) Date of Patent: Apr. 15, 2025

(54) ADC APPARATUS AND CONTROL METHOD

(71) Applicant: LEN TECH Inc., Plano, TX (US)

(72) Inventor: Gonggui Xu, Plano, TX (US)

(73) Assignee: LEN TECH Inc., Plano, TX (US)

(*) Notice: Subject to any disclaimer, the term of this patent is extended or adjusted under 35 U.S.C. 154(b) by 151 days.

(21) Appl. No.: 18/210,639

(22) Filed: Jun. 15, 2023

(65) Prior Publication Data

US 2024/0421826 A1 Dec. 19, 2024

(51) Int. Cl.
*H03M 1/06* (2006.01)

(52) U.S. Cl.
CPC .................. *H03M 1/0602* (2013.01)

(58) Field of Classification Search
CPC .................................. H03M 1/0602
See application file for complete search history.

(56) References Cited

U.S. PATENT DOCUMENTS

| | | | |
|---|---|---|---|
| 7,999,719 B2* | 8/2011 | Jeon | H03M 1/164 341/172 |
| 8,665,125 B2* | 3/2014 | Reinhold | H03M 1/1061 341/172 |
| 8,933,830 B1* | 1/2015 | Jeon | H03M 1/1071 341/110 |
| 9,059,734 B1* | 6/2015 | Strode | H03M 1/66 |
| 9,319,059 B1* | 4/2016 | Sharma | H03M 1/403 |
| 10,554,181 B1* | 2/2020 | Banerjee | H03F 1/301 |
| 11,088,704 B2* | 8/2021 | Chen | H03M 3/394 |
| 11,095,301 B1* | 8/2021 | Tang | H03M 1/1014 |
| 11,196,434 B1* | 12/2021 | Sun | H03M 1/0626 |
| 2010/0156692 A1* | 6/2010 | Jeon | H03M 1/164 341/162 |
| 2010/0194619 A1* | 8/2010 | Ohnhaeuser | H03M 1/002 341/159 |
| 2010/0207791 A1* | 8/2010 | Ohnhaeuser | H03M 1/0612 341/135 |
| 2011/0304493 A1* | 12/2011 | Mitikiri | H03M 1/462 341/150 |
| 2012/0262316 A1* | 10/2012 | Strode | H03M 1/162 341/110 |
| 2013/0002467 A1* | 1/2013 | Wang | H03M 1/145 341/172 |
| 2013/0093609 A1* | 4/2013 | Chang | H03M 1/462 341/110 |
| 2017/0163279 A1* | 6/2017 | Kinyua | H03M 1/468 |
| 2021/0336607 A1* | 10/2021 | Peh | H03K 3/013 |
| 2023/0336184 A1* | 10/2023 | Huang | H03M 1/0692 |
| 2024/0297660 A1* | 9/2024 | Xu | H03M 1/442 |

* cited by examiner

*Primary Examiner* — Lam T Mai
(74) *Attorney, Agent, or Firm* — AP3 Law Firm PLLC

(57) ABSTRACT

An apparatus includes a high gain input stage configured as an integrator in a successive approximation register (SAR) analog-to-digital converter (ADC), a clamping and filtering stage configured to clamp a voltage on a high impedance node to a predetermined level approximately equal to a diode voltage drop in a clamping mode of an SAR cycle, and a decision-making stage connected to an output of the clamping and filtering stage.

20 Claims, 7 Drawing Sheets

ADC APPARATUS AND CONTROL METHOD

TECHNICAL FIELD

The present invention relates to an analog-to-digital converter (ADC) apparatus and control method, and, in particular embodiments, to an apparatus and control method for improving the performance of a successive approximation register (SAR) ADC.

BACKGROUND

Analog-to-digital converters are commonly used in digital electronics systems to convert analog signals into digital signals. The digital signals may be further processed by various digital processors such as digital audio processors, digital video processors, wireless communication processors and the like.

In some applications, analog-to-digital converters may be implemented as standalone semiconductor devices. Alternatively, analog-to-digital converters may be integrated with other circuitry on a single integrated circuit. While various analog-to-digital architectures may be used today, the successive approximation analog-to-digital converter is widely used in a variety of applications requiring medium conversion speed and resolution.

The successive approximation analog-to-digital converter converts an input analog signal to a digital signal by comparing various output values of a digital-to-analog converter with the input analog signal over a number of clock cycles. For example, in a first SAR conversion cycle, the most significant bit of the digital signal is determined by comparing the input analog signal with the midscale output of the digital-to-analog converter. If the value of the input analog signal is greater than the midscale output of the digital-to-analog converter, the most significant bit of the digital signal is set to a logical one. On the other hand, if the value of the input analog signal is less than the midscale output of the digital-to-analog converter, the most significant bit of the digital signal is set to a logical zero. In a second SAR conversion cycle, the input analog signal is compared with the ¼ scale or ¾ scale output of the digital-to-analog converter depending on the outcome of the first SAR conversion cycle. In the second SAR conversion cycle, the second most significant bit is determined.

The comparison method described above continues all the way down to the least significant bit of the digital signal. Once the least significant bit has been determined, the analog-to-digital conversion is complete and the digital signal is available at a register of the analog-to-digital converter.

SUMMARY

These and other problems are generally solved or circumvented, and technical advantages are generally achieved, by preferred embodiments of the present disclosure which provide an apparatus and control method for improving the performance of a SAR ADC.

In accordance with an embodiment, an apparatus comprises a high gain input stage configured as an integrator in a successive approximation register (SAR) analog-to-digital converter (ADC), a clamping and filtering stage configured to clamp a voltage on a high impedance node to a predetermined level approximately equal to a diode voltage drop in a clamping mode of an SAR cycle, and a decision-making stage connected to an output of the clamping and filtering stage.

In accordance with another embodiment, a method comprises configuring an analog-to-digital converter (ADC) to convert an analog signal into a digital signal, the ADC comprising a capacitive digital-to-analog stage, an error correction stage, a switch array, a high gain input stage, a clamping and filtering stage and a decision-making stage, in a clamping mode of a successive approximation register (SAR) cycle, clamping a voltage on a high impedance node to a predetermined level approximately equal to a diode voltage drop, resetting the decision-making stage, and isolating the decision-making stage from the high gain input stage and the clamping and filtering stage, and in a comparison mode of the SAR cycle, connecting the decision-making stage to the high gain input stage and the clamping and filtering stage, and amplifying, by the high gain input stage, the clamping and filtering stage and the decision-making stage, a difference of the analog signal and an output of the capacitive digital-to-analog stage to generate an output of the ADC.

In accordance with yet another embodiment, an ADC comprises a binary-weighted capacitor array configured as a capacitive digital-to-analog stage coupled between an SAR bus and three voltage buses including an input voltage bus, a reference voltage bus and a ground voltage bus, an error correction stage connected to the SAR bus, wherein the error correction stage is configured to perform a linear correction on a result obtained from a plurality of successive approximation register cycles applied to the capacitive digital-to-analog stage, a high gain input stage having an input connected to the SAR bus, a clamping and filtering stage connected to an output of the high gain input stage, wherein the clamping and filtering stage is configured to clamp a voltage on a high impedance node to a predetermined level approximately equal to a diode voltage drop in a clamping mode of an SAR cycle, and a decision-making stage connected to an output of the clamping and filtering stage.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely an apparatus and control method for improving the performance of a successive approximation register (SAR) analog-to-digital converter (ADC). The disclosure may also be applied, however, to a variety of ADCs. Hereinafter, various embodiments will be explained in detail with reference to the accompanying drawings.

Figure 1:
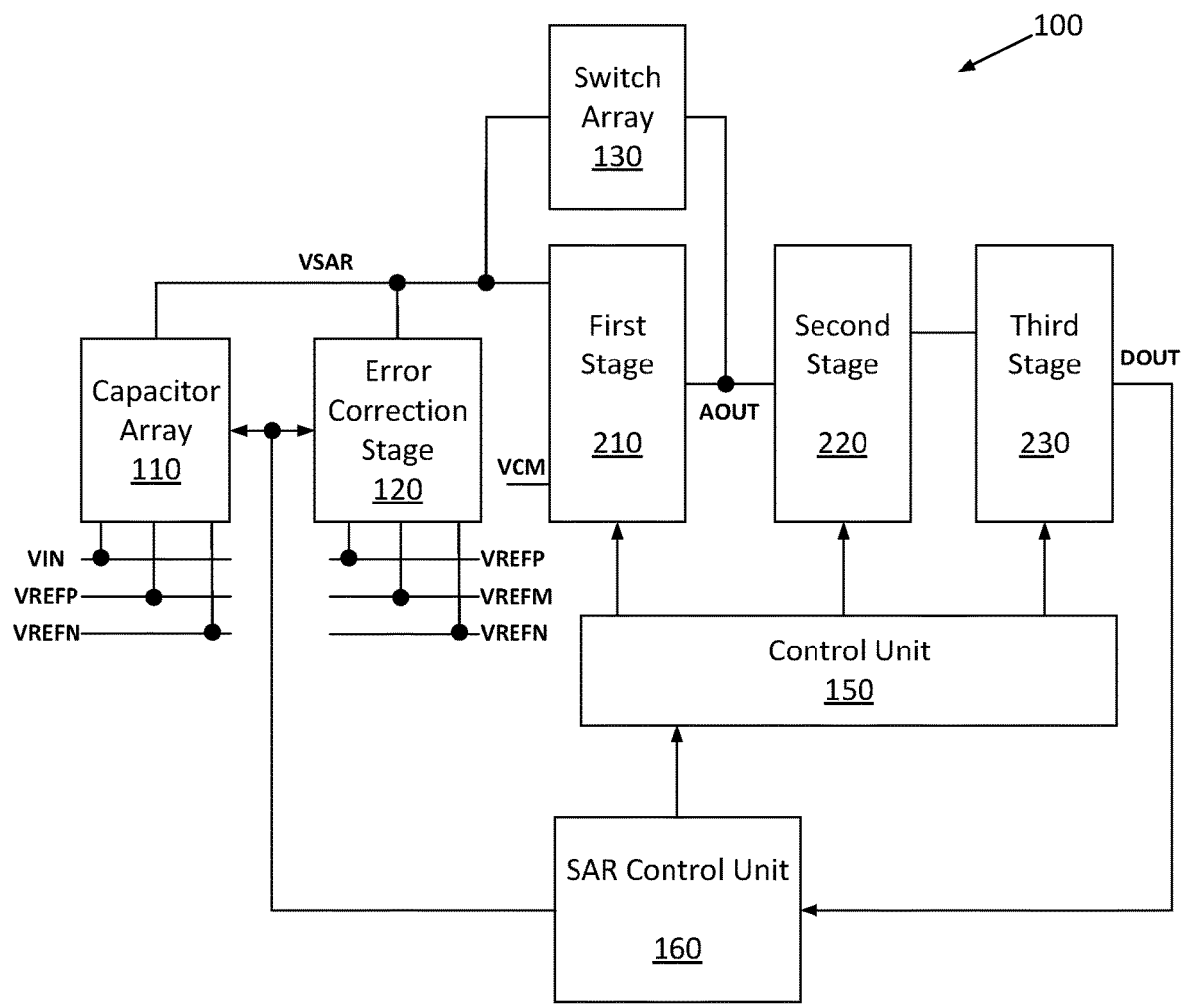
FIG. 1 illustrates a block diagram of an SAR ADC in accordance with various embodiments of the present disclosure.

FIG. 1 illustrates a block diagram of an SAR ADC in accordance with various embodiments of the present disclosure. The SAR ADC 100 comprises a capacitor array 110, an error correction stage 120, a switch array 130, a first stage 210, a second stage 220, a third stage 230, a control unit 150 and an SAR control unit 160.

In some embodiments, the capacitor array 110 is a binary-weighted capacitor array, which functions as a capacitive digital-to-analog stage. Throughout the description, the capacitor array 110 is alternatively referred to as a binary-weighted capacitor array 110 or a capacitive digital-to-analog stage 110. The error correction stage 120 is a linear-weighted capacitor array. Throughout the description, the error correction stage 120 is alternatively referred to as a linear-weighted capacitor array 120.

In some embodiments, the first stage 210 is implemented as a high gain input stage. Throughout the description, the first stage 210 is alternatively referred to as a high gain input stage 210. The second stage 220 is implemented as a clamping and filtering stage. Throughout the description, the second stage 220 is alternatively referred to as a clamping and filtering stage 220. The third stage 230 is implemented as a decision-making stage. Throughout the description, the third stage 230 is alternatively referred to as a decision-making stage 230.

As shown in FIG. 1, the binary-weighted capacitor array 110 is coupled between an SAR bus VSAR and three voltage buses including VIN, VREFP and VREFN. VIN is an input voltage bus configured to receive an analog signal to be converted by the SAR ADC 100. VREFP is a reference voltage bus. VREFN is a ground voltage bus. In the binary-weighted capacitor array 110, each capacitor has a first terminal connected to the SAR bus, and a second terminal coupled to the input voltage bus, the reference voltage bus and the ground voltage bus through a single pole triple throw switch. The single pole triple throw switches in the binary-weighted capacitor array 110 are controlled by the SAR control unit 160 according to the operating principle of the SAR ADC.

In the linear-weighted capacitor array 120, each capacitor has a first terminal connected to the SAR bus, and a second terminal coupled to the VREFM bus, the reference voltage bus VREFP and the ground voltage bus VREFN through a single pole triple throw switch. The single pole triple throw switches in the linear-weighted capacitor array 120 are controlled by the SAR control unit 160 according to the operating principle of the SAR ADC with extra correction bits.

In operation, the analog signal to be converted by the SAR ADC 100 is fed into the input voltage bus VIN. A predetermined reference voltage is fed into the reference voltage bus VREFP. The ground voltage bus is connected to ground.

In a sample mode of the SAR ADC 100, the single pole triple throw switches in the binary-weighted capacitor array 110 are connected to the input voltage bus VIN. The analog signal is sampled by the binary-weighted capacitor array 110. VREFM is connected to the linear-weighted capacitor array 120 during the sample mode.

In a hold mode of the SAR ADC 100, the single pole triple throw switches in the binary-weighted capacitor array 110 are connected to the ground voltage bus. VREFM is connected to the linear-weighted capacitor array 120 during the hold mode.

In a redistribution mode of the SAR ADC 100, a most significant bit (MSB) capacitor of the binary-weighted capacitor array 110 is connected to the reference voltage bus VREFP. Other capacitors of the binary-weighted capacitor array 110 is to the ground voltage bus. The MSB of the digital output signal is determined based on a comparison between the analog signal and one half of the reference voltage. For subsequent SAR cycles, the MSB capacitor is connected to the reference voltage bus VREFP when the MSB is determined to be a logic high bit. On the other hand, the MSB capacitor is connected to the ground voltage bus when the MSB is determined to be a logic low bit. After determining the MSB, this process continues until a least significant bit (LSB) is determined after a plurality of SAR cycles. During the processing of obtaining the bits from MSB to LSB in the redistribution mode, the linear-weighted capacitor array 120 is continued to connected to VREFM.

As shown in FIG. 1, the error correction stage 120 is coupled between an SAR bus VSAR and three voltage buses including VREFP, VREFM and VREFN. VREFP is the reference voltage bus. VREFN is the ground voltage bus. VREFM is another reference voltage bus. In some embodiments, the voltage on VREFM is equal to one half of the voltage on VREFP.

In operation, the error correction stage 120 is configured to perform a linear correction on the digital result obtained from the binary-weighted capacitor array 110 after the plurality of SAR cycles has been applied to the capacitive digital-to-analog stage 110.

The error correction stage 120 comprises an adjustable capacitor. In some embodiments, the capacitance value of the adjustable capacitor is equal to that of the LSB capacitor of the binary-weighted capacitor array 110.

In operation, once the LSB has been determined, the single pole triple throw switch of the error correction stage 120 is switched from VREFM to VREFP. The adjustable capacitor of the error correction stage 120 is connected to the reference voltage bus VREFP. The reference voltage on the reference voltage bus is redistributed between the adjustable capacitor and the binary-weighted capacitor array 110 to obtain a redistributed voltage on the common node of the adjustable capacitor and the binary-weighted capacitor array 110. This is equivalent to increasing the voltage on VSAR. The voltage on VSAR is compared with VCM. The digital result obtained from the binary-weighted capacitor array 110 is incremented by a binary number 1 when the voltage on VSAR is less than VCM (common mode voltage). On the other hand, the digital result obtained from the binary-weighted capacitor array 110 is decreased by a binary number 1 when the voltage on VSAR is greater than VCM. This process repeats until a correct digital result has been obtained.

The switch array 130 is connected between the SAR bus VSAR and an AOUT node as shown in FIG. 1. The switch array 130 comprises a plurality of switches. In an autozeroing mode, the switch array 130 is configured such that an input offset of the high gain input stage 210 is stored on the SAR bus VSAR. The input offset stored on VSAR is used to achieve offset cancellation during normal operation.

As shown in FIG. 1, the high gain input stage 210, the clamping and filtering stage 220 and the decision-making stage 230 are connected in cascade between the SAR voltage bus and an output of the SAR ADC 100. The high gain input stage 210 has an input connected to the SAR voltage bus VSAR. The clamping and filtering stage 220 is connected to an output of the high gain input stage 210. In operation, in a clamping mode, the clamping and filtering stage 220 is configured to clamp a voltage on a high impedance node to a predetermined level approximately equal to a diode voltage drop. The decision-making stage 230 is connected to an output of the clamping and filtering stage 220. In a comparison mode, the high gain input stage 210 is configured as a first amplifier gain stage. The clamping and filtering stage 220 is configured as a second amplifier gain stage. The decision-making stage 230 is configured as a third amplifier gain stage. The first amplifier gain stage, the second amplifier gain stage and the third amplifier gain stage are connected in cascade to function as an amplifier stage of the SAR ADC 100.

The high gain input stage 210, the clamping and filtering stage 220 and the decision-making stage 230 comprise a plurality of auxiliary switches. By configuring the on and off of the plurality of auxiliary switches, the high gain input stage 210, the clamping and filtering stage 220 and the decision-making stage 230 are able to operate in different modes (e.g., clamping mode and comparison mode). The control unit 150 is configured to receive a control signal from the SAR control unit 160. Based on the control signal, the control unit 150 is configured to generate various gate drive signals for controlling the plurality of auxiliary switches. The detailed operating principle of the plurality of auxiliary switches will be discussed below with respect to FIGS. 4-6.

The function units shown in FIG. 1 is merely an example, which should not unduly limit the scope of the claims. Depending on different applications and design needs, other function units may be included in the SAR ADC 100. For example, a latch may be coupled to the output of the third amplifier gain stage 230.

Figure 2:
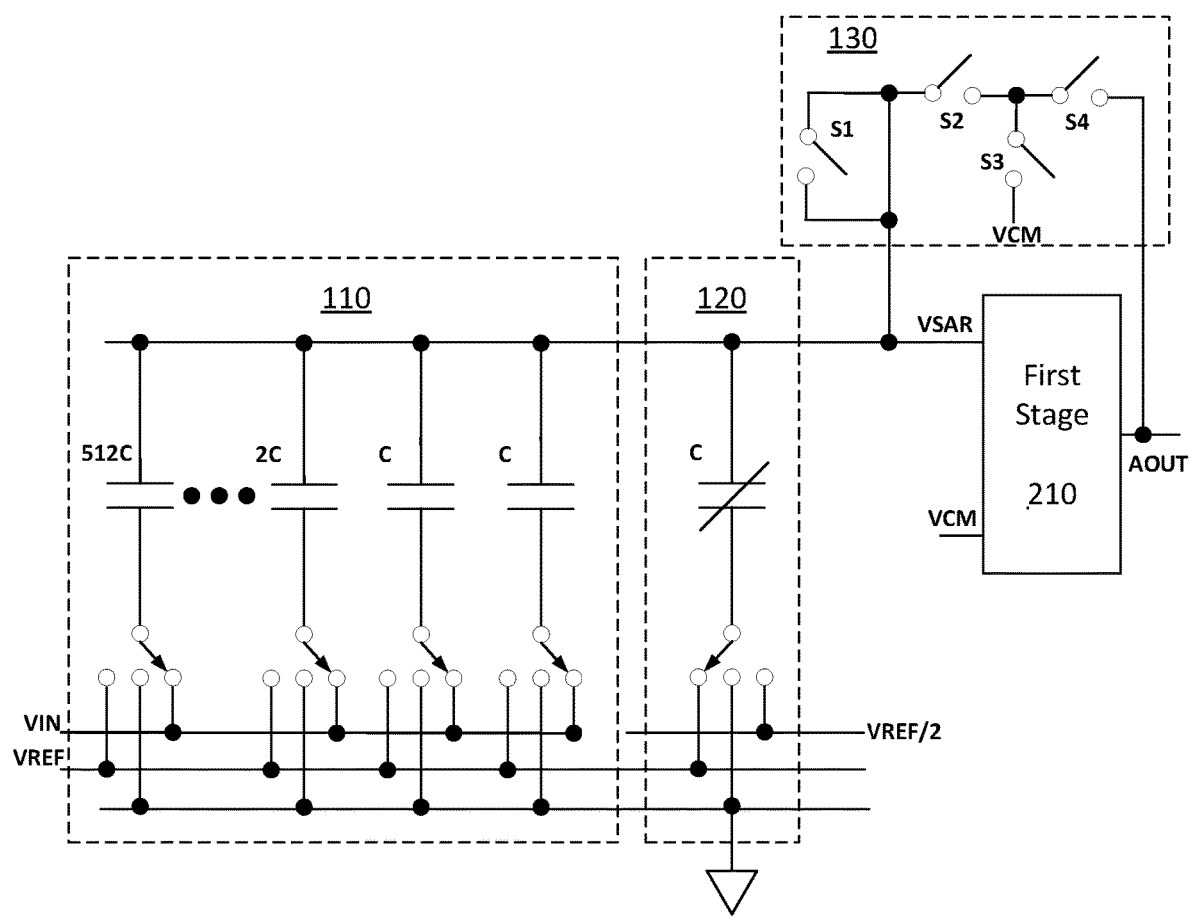
FIG. 2 illustrates schematic diagrams of the binary-weighted capacitor array, the error correction stage and the switch array shown in FIG. 1 in accordance with various embodiments of the present disclosure.

FIG. 2 illustrates schematic diagrams of the binary-weighted capacitor array, the error correction stage and the switch array shown in FIG. 1 in accordance with various embodiments of the present disclosure. The binary-weighted capacitor array 110 comprises a plurality of capacitors. All capacitors have binary weighted values. The last two capacitors of the binary-weighted capacitor array 110 have the same binary weighted value. These two capacitors are connected in parallel so that the total capacitance of the 11 capacitors is equal to 1024C (2×512C).

It should be noted that FIG. 2 illustrates only 11 capacitors (from C to 512C) of a SAR ADC that may include a plurality of such capacitors. The number of capacitors illustrated herein is limited solely for the purpose of clearly illustrating the inventive aspects of the various embodiments. The present disclosure is not limited to any specific number of capacitors in the binary-weighted capacitor array 110.

In some embodiments, the binary-weighted capacitor array 110 comprises 11 capacitors including C, C, 2C, 4C, 8C, 16C, 32C, 64C, 128C, 256C and 512C. Each capacitor (e.g., 512C) of the binary-weighted capacitor array 110 has a first terminal connected to the SAR voltage bus VSAR, and a second terminal coupled to VIN, VREF and ground through a single pole triple throw switch.

In operation, in a sample mode, a switch (not shown) is turned on to connect the SAR voltage bus VSAR to ground. The single pole triple throw switches are switched to VIN. Due to charging, a total charge (Q) equal to 1024C×VIN is stored on the lower plates of the capacitors of the binary-weighted capacitor array 110. In a hold mode, the single pole triple throw switches are switched to ground. As a result, the voltage on the SAR voltage bus VSAR is equal to −VIN.

As shown in FIG. 2, capacitor 512C is an MSB capacitor. In a redistribution mode, the single pole triple throw switch connected to capacitor 512C is switched to VREF. The sum of all the capacitors is 1024C. According to the superposition principle, the voltage on the SAR voltage bus VSAR is equal to one half of the reference voltage minus VIN (VREF/2−VIN). In some embodiments, the common mode voltage VCM is equal to zero. The first stage 210 compares the voltage on the SAR voltage bus VSAR to zero. This is equivalent to comparing VIN with one half of VREF (VERF/2). The result of this comparison determines the MSB value of the digital output of the SAR ADC 100. This result also determines whether the MSB capacitor 512C is connected to VREF or ground in subsequent SAR cycles. For the subsequent SAR cycles, the MSB capacitor is connected to VREF when the MSB is of a logic high state. On the other hand, the MSB capacitor 512C is connected to ground when the MSB is of a logic low state. This process continues until a least significant bit (LSB) is determined after nine SAR cycles.

The error correction stage 120 comprises an adjustable capacitor. The adjustable capacitor can be adjusted in a range from 1C to 512C. In operation, the adjustable capacitor is configured to perform a linear correction on the result obtained from the ten SAR cycles.

In operation, once the ten SAR cycles have been completed, the adjustable capacitor of the error correction stage 120 is connected to VREF. VREF is redistributed between the adjustable capacitor and the binary-weighted capacitor array 110 to obtain a redistributed voltage on the SAR voltage bus VSAR. The digital result obtained from the ten SAR cycles is incremented by a binary number 1 when the voltage on VSAR is less than VCM. On the other hand, the digital result obtained from the ten SAR cycles is decreased by a binary number 1 when the voltage on VSAR is greater than VCM. This process repeats until a correct digital result has been obtained.

It should be noted the adjustable capacitor shown in FIG. 2 is merely an example. Depending on different applications and design needs, the adjustable capacitor can be replaced by a plurality of capacitors. Each of the plurality of capacitors is connected to VREF, VREF/2 and ground through a single pole triple throw switch.

It should further be noted that in the linear correction, the adjustable capacitor may be connected to VREF/2 to achieve a fine step for correcting the digital result.

The switch array 130 comprises switches S1, S2, S3 and S4. In some embodiments, S1 is a dummy switch. S1 is employed to cancel charge injection. As shown in FIGS. 2, S2 and S4 are connected in series between VSAR and AOUT. S3 is connected between a common node of S2 and S4, and the common mode voltage VCM. The switch array 130 is employed to achieve offset cancellation, which will be discussed below with respect to FIG. 4.

Figure 3:
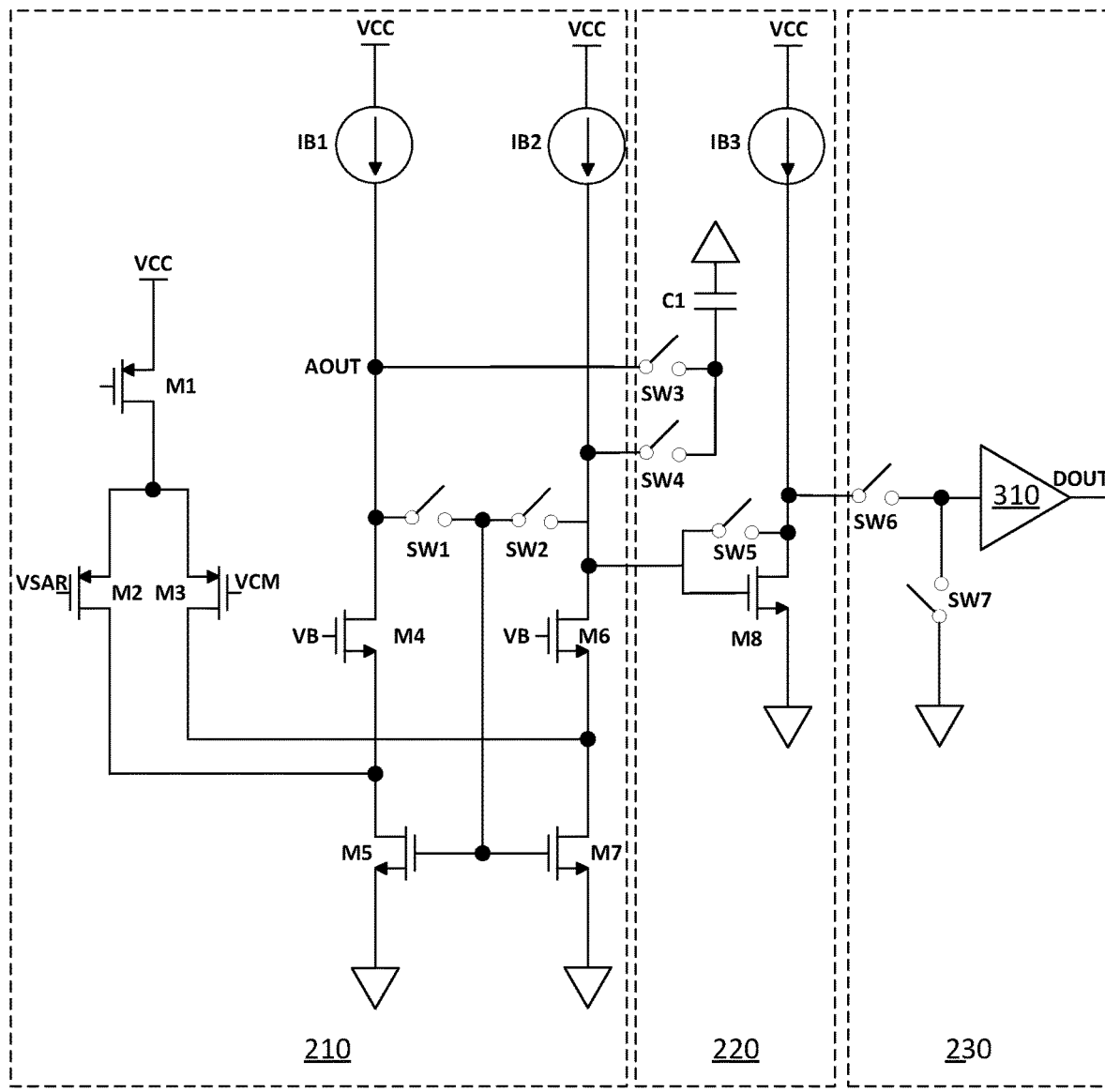
FIG. 3 illustrates schematic diagrams of the high gain input stage, the clamping and filtering stage and the decision-making stage shown in FIG. 2 in accordance with various embodiments of the present disclosure.

FIG. 3 illustrates schematic diagrams of the high gain input stage, the clamping and filtering stage and the decision-making stage shown in FIG. 2 in accordance with various embodiments of the present disclosure. The high gain input stage 210 comprises a first transistor M1, a second transistor M2, a third transistor M3, a fourth transistor M4, a fifth transistor M5, a sixth transistor M6, a seventh transistor M7, a first current source IB1, a second current source IB2, a first auxiliary switch SW1 and a second auxiliary switch SW2.

The first transistor M1 is connected to a bias voltage bus VCC. The first transistor M1 is configured as a current source. The second transistor M2 and the third transistor M3 form a differential pair. The gate of the second transistor M2 is connected to the SAR voltage bus VSAR. The gate of the third transistor M3 is connected to the common mode voltage VCM.

The first current source IB1, the fourth transistor M4 and the fifth transistor M5 are connected in series between the bias voltage bus VCC and ground. The first current source IB1, the fourth transistor M4 and the fifth transistor M5 form a first gain stage leg of the high gain input stage 210.

The second current source IB2, the sixth transistor M6 and the seventh transistor M7 are connected in series between the bias voltage bus VCC and ground. The second current source IB2, the sixth transistor M6 and the seventh transistor M7 form a second gain stage leg of the high gain input stage 210.

The first auxiliary switch SW1 and the second auxiliary switch SW2 are connected in series between a common node of the first current source IB1 and the fourth transistor M4, and a common node of the second current source IB2 and the sixth transistor M6. The gates of the fifth transistor M5 and the seventh transistor M7 are connected together, and further connected to a common node of the first auxiliary switch SW1 and the second auxiliary switch S2. The gates of the fourth transistor M4 and the sixth transistor M6 are connected to another predetermined bias voltage VB.

The clamping and filtering stage 220 comprises a third auxiliary switch SW3, a fourth auxiliary switch SW4, a fifth auxiliary switch SW5, a capacitor C1, a third current source IB3 and an eighth transistor M8.

The third auxiliary switch SW3 and the capacitor C1 are connected in series between the common node of the first current source IB1 and the fourth transistor M4, and ground. The fourth auxiliary switch SW4 is connected between the common node of the second current source IB2 and the sixth transistor M6, and a common node of the third auxiliary switch SW3 and the capacitor C1. The third current source IB3 and the eighth transistor M8 are connected in series between the bias voltage bus VCC and ground. The fifth auxiliary switch SW5 is connected between a drain of the eighth transistor M8 and a gate of the eighth transistor M8.

The decision-making stage 230 comprises a sixth auxiliary switch SW6, a seventh auxiliary switch SW7 and an amplifier 310. The sixth auxiliary switch SW6 and the seventh auxiliary switch SW7 are connected in series between a common node of the third current source IB3 and the eighth transistor M8, and ground. The amplifier 310 has an input connected to a common node of the sixth auxiliary switch SW6 and the seventh auxiliary switch SW7.

Figure 4:
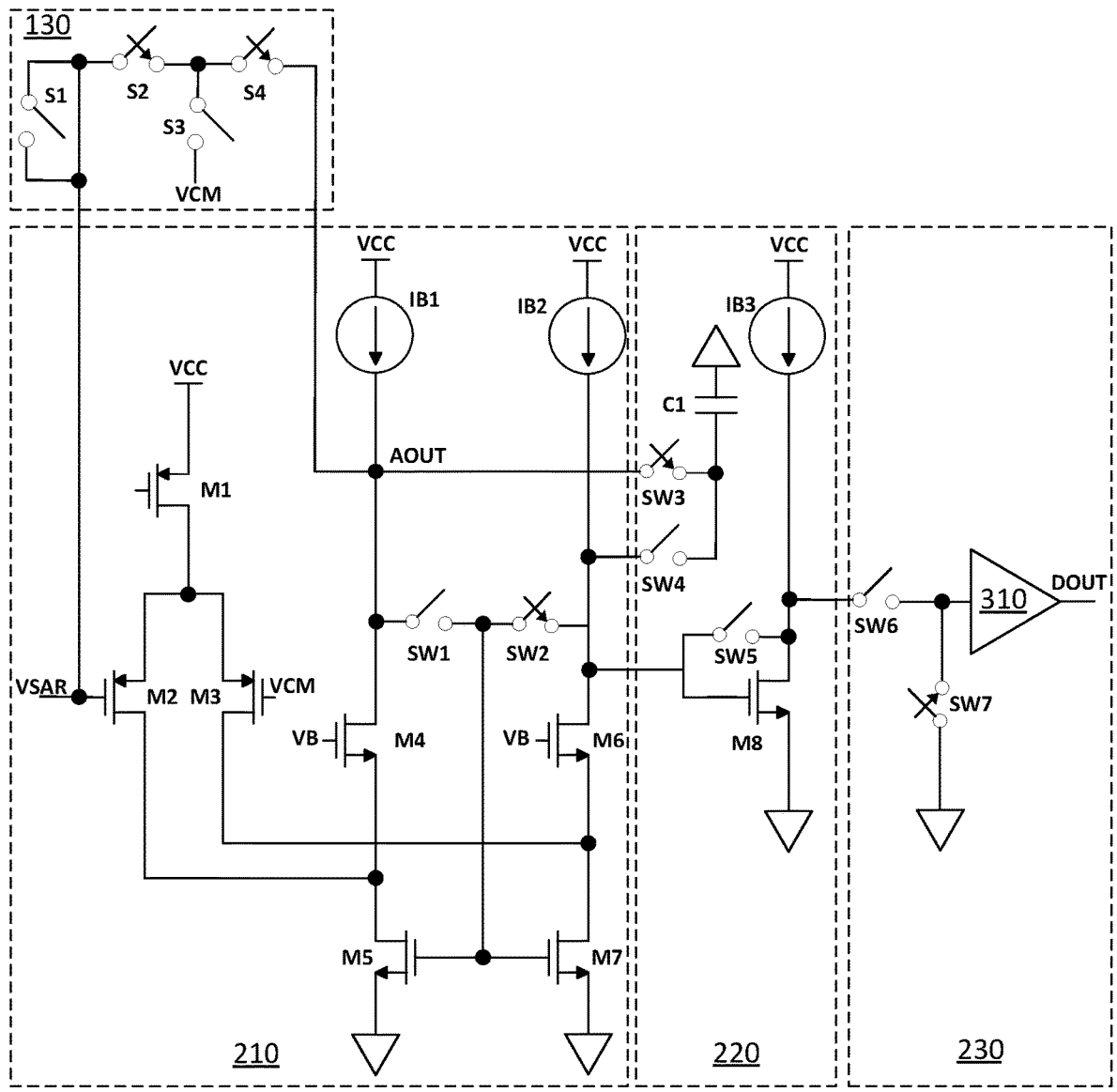
FIG. 4 illustrates schematic diagrams of the high gain input stage, the clamping and filtering stage and the decision-making stage when the SAR ADC is configured to operate in an auto-zeroing mode in accordance with various embodiments of the present disclosure.

FIG. 4 illustrates schematic diagrams of the high gain input stage, the clamping and filtering stage and the decision-making stage when the SAR ADC is configured to operate in an auto-zeroing mode in accordance with various embodiments of the present disclosure. In the ADC process, the SAR ADC 100 operates in an auto-zeroing mode when VIN is sampled. In the auto-zeroing mode, the high gain input stage 210 is configured as a closed loop unity gain amplifier. S2 and S4 of the switch array 130 are turned on. S1 and S3 of the switch array 130 are turned off. Under this configuration, the input offset of the high gain input stage 210 is stored on the SAR voltage bus VSAR. Furthermore, in the auto-zeroing mode, the first switch SW1, the fourth switch SW4, the fifth switch SW5 and the sixth switch SW6 are turned off. The second switch SW2, the third switch SW3 and the seventh switch SW7 are turned on.

Each SAR cycle includes a clamping mode and a comparison mode. The system configuration in the clamping mode will be described below with respect to FIG. 5. The system configuration in the comparison mode will be described below with respect to FIG. 6.

Figure 5:
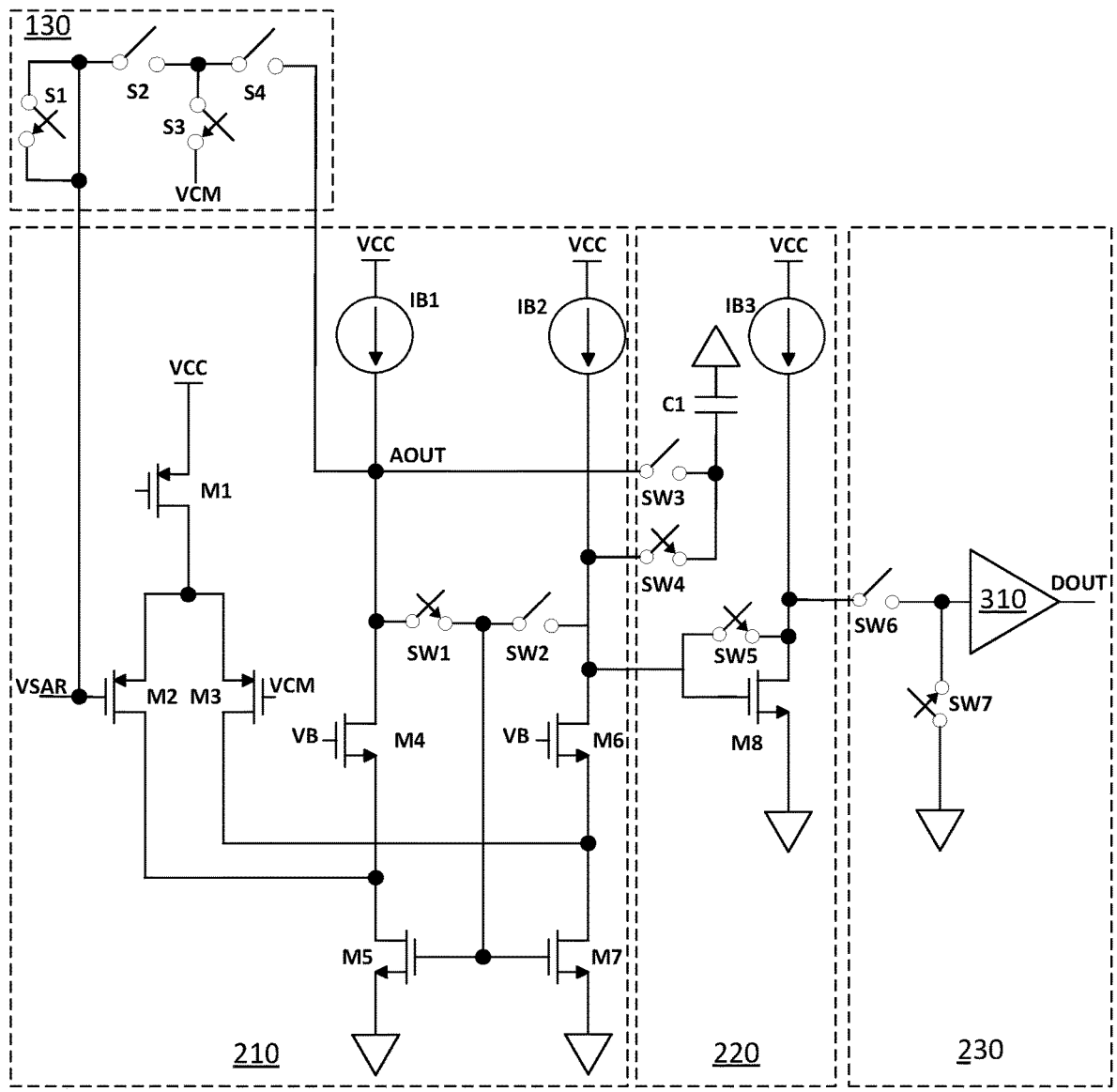
FIG. 5 illustrates schematic diagrams of the high gain input stage, the clamping and filtering stage and the decision-making stage when the SAR ADC is configured to operate in a clamping mode in accordance with various embodiments of the present disclosure.

FIG. 5 illustrates schematic diagrams of the high gain input stage, the clamping and filtering stage and the decision-making stage when the SAR ADC is configured to operate in a clamping mode in accordance with various embodiments of the present disclosure. In the clamping mode of the SAR cycle, the first switch SW1, the fourth switch SW4, the fifth switch SW5 and the seventh switch SW7 are turned on. The second switch SW2, the third switch SW3 and the sixth switch SW6 are turned off.

In the clamping mode, the high gain input stage 210 is configured as an integrator to filter noise. The previous result generated by the decision-making stage 230 is reset in the clamping mode. Since the sixth switch SW6 is turned off, the decision-making stage 230 is isolated from the high gain input stage 210 and the clamping and filtering stage 220. The common node of the second current source IB2 and the sixth transistor M6 is a high impedance node. Since the fifth switch SW5 is turned on, the clamping and filtering stage 220 clamps the voltage on the high impedance node to a predetermined level approximately equal to the diode voltage drop (e.g., the gate-to-source voltage drop of M8).

One advantageous feature of clamping the voltage on the high impedance node to a predetermined level is that the voltage on the high impedance node is set at a suitable voltage. This suitable voltage helps the SAR ADC 100 quickly generate the final result.

Figure 6:
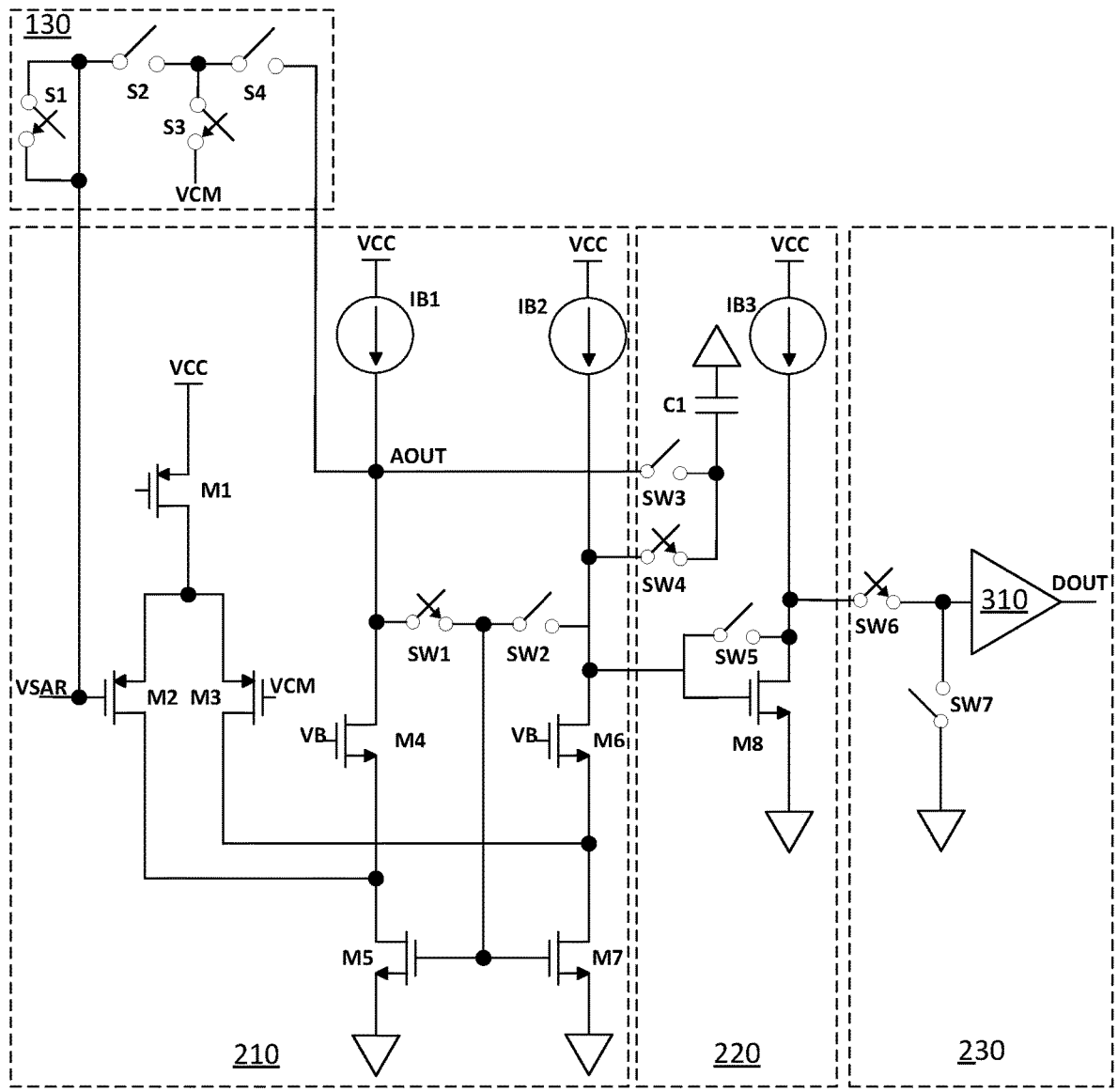
FIG. 6 illustrates schematic diagrams of the high gain input stage, the clamping and filtering stage and the decision-making stage when the SAR ADC is configured to operate in a comparison mode in accordance with various embodiments of the present disclosure.

FIG. 6 illustrates schematic diagrams of the high gain input stage, the clamping and filtering stage and the decision-making stage when the SAR ADC is configured to operate in a comparison mode in accordance with various embodiments of the present disclosure. In the comparison mode, the first switch SW1, the fourth switch SW4 and the sixth switch SW6 are turned on. The second switch SW2, the third switch SW3, the fifth switch SW5 and the seventh switch SW7 are turned off.

In the comparison mode of the SAR cycle, the high gain input stage 210 is configured as a first amplifier gain stage. The voltage on the SAR voltage bus VSAR is integrated into the capacitor C1 through the differential pair formed by M2 and M3. The clamping and filtering stage 220 is out of the clamping mode. The clamping and filtering stage 220 is configured as a second amplifier gain stage. The decision-making stage 230 is out of the resetting process. The decision-making stage 230 is configured as a third amplifier gain stage. As shown in FIG. 6, the first amplifier gain stage, the second amplifier gain stage and the third amplifier gain stage are connected in cascade to amplify the input signal until the SAR ADC 100 generates a result.

Figure 7:
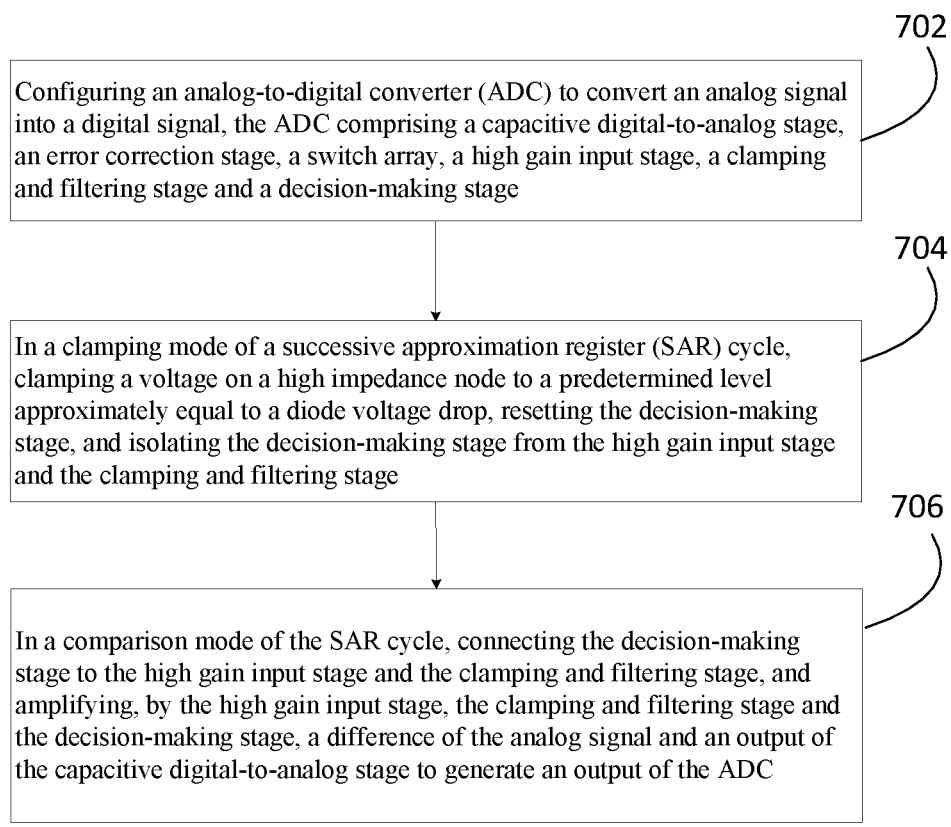
FIG. 7 illustrates a flow chart of controlling and operating the SAR ADC shown in FIG. 1 in accordance with various embodiments of the present disclosure.

FIG. 7 illustrates a flow chart of controlling and operating the ADC shown in FIG. 1 in accordance with various embodiments of the present disclosure. This flowchart shown in FIG. 7 is merely an example, which should not unduly limit the scope of the claims. One of ordinary skill in the art would recognize many variations, alternatives, and modifications. For example, various steps illustrated in FIG. 7 may be added, removed, replaced, rearranged and repeated.

At step 702, an analog-to-digital converter (ADC) is configured to convert an analog signal into a digital signal. The ADC comprises a capacitive digital-to-analog stage, an error correction stage, a switch array, a high gain input stage, a clamping and filtering stage and a decision-making stage.

At step 704, in a clamping mode of a successive approximation register (SAR) cycle, a voltage on a high impedance node is clamped to a predetermined level approximately equal to a diode voltage drop. The decision-making stage is reset, and the decision-making stage is isolated from the high gain input stage and the clamping and filtering stage.

At step 706, in a comparison mode of the SAR cycle, the decision-making stage is connected to the high gain input stage and the clamping and filtering stage. By the high gain input stage, the clamping and filtering stage and the decision-making stage, a difference of the analog signal and an output of the capacitive digital-to-analog stage is amplified to generate an output of the ADC.

Referring back to FIG. 3, the high gain input stage comprises a first transistor configured as a current source, a differential pair comprising a second transistor and a third transistor, a first gain stage leg comprising a first current source, a fourth transistor and a fifth transistor connected in series between a bias voltage bus and ground, a second gain stage leg comprising a second current source, a sixth transistor and a seventh transistor connected in series between the bias voltage bus and ground, and a first auxiliary switch and a second auxiliary switch connected in series between a common node of the first current source and the fourth transistor, and a common node of the second current source and the sixth transistor, wherein gates of the fifth transistor and the seventh transistor are connected together, and further connected to a common node of the first auxiliary switch and the second auxiliary switch.

Referring back to FIG. 3, the clamping and filtering stage comprises a third auxiliary switch and a capacitor connected in series between the common node of the first current source and the fourth transistor, and ground, a fourth auxiliary switch connected between the common node of the second current source and the sixth transistor, and a common node of the third auxiliary switch and the capacitor, a third current source and an eighth transistor connected in series between the bias voltage bus and ground, and a fifth auxiliary switch connected between a drain of the eighth transistor and a gate of the eighth transistor.

Referring back to FIG. 3, the decision-making stage comprises a sixth auxiliary switch and a seventh auxiliary switch connected in series between a common node of the third current source and the eighth transistor, and ground, and an amplifier having an input connected to a common node of the sixth auxiliary switch and the seventh auxiliary switch.

Referring back to FIG. 4, the method further comprises in an auto-zeroing mode, configuring the high gain input stage as a closed loop unity gain amplifier, and configuring the switch array to store an input offset of the high gain input stage on an input bus connected to the high gain input stage, wherein in the auto-zeroing mode, the first switch, the fourth switch, the fifth switch and the sixth switch are turned off, and the second switch, the third switch and the seventh switch are turned on.

Referring back to FIG. 5, the method further comprises in the clamping mode of the SAR cycle, configuring the high gain input stage as an integrator to filter noise, and configuring the clamping and filtering stage to clamp the voltage on the high impedance node to the predetermined level approximately equal to the diode voltage drop, wherein in the clamping mode, the first switch, the fourth switch, the fifth switch and the seventh switch are turned on, and the second switch, the third switch and the sixth switch are turned off.

The common node of the second current source and the sixth transistor is the high impedance node.

Referring back to FIG. 6, the method further comprises in the comparison mode of the SAR cycle, configuring the high gain input stage as a first amplifier gain stage, configuring the clamping and filtering stage as a second amplifier gain stage, and configuring the decision-making stage as a third amplifier gain stage, wherein the first amplifier gain stage, the second amplifier gain stage and the third amplifier gain stage are connected in cascade, and in the comparison mode, the first switch, the fourth switch and the sixth switch are turned on, and the second switch, the third switch, the fifth switch and the seventh switch are turned off.

The method further comprises receiving the analog signal, a reference voltage and a ground voltage, sampling the analog signal on a binary-weighted capacitor array, connecting a most significant bit (MSB) capacitor of the binary-weighted capacitor array to the reference voltage, and connecting other capacitors of the binary-weighted capacitor array to the ground voltage, determining an MSB based on a comparison between the analog signal and one half of the reference voltage, and for subsequent SAR cycles, connecting the MSB capacitor to the reference voltage when the MSB is determined to be a logic high bit, and connecting the MSB capacitor to the ground voltage when the MSB is determined to be a logic low bit.

The method further comprises after a plurality of SAR cycles, determining a least significant bit (LSB), and after determining the LSB, performing a linear correction on a result obtained from the plurality of SAR cycles.

The method further comprises connecting an adjustable capacitor of the error correction stage to the reference voltage, redistributing the reference voltage between the adjustable capacitor and a binary-weighted capacitor array to obtain a redistributed voltage on a common node of the adjustable capacitor and the binary-weighted capacitor array, and incrementing the result obtained from the plurality of SAR cycles by a binary number 1 when the redistributed voltage is less than a common mode reference voltage.

The method further comprises connecting an adjustable capacitor of the error correction stage to the reference voltage, redistributing the reference voltage between the adjustable capacitor and a binary-weighted capacitor array to obtain a redistributed voltage on a common node of the adjustable capacitor and the binary-weighted capacitor array, and decreasing the result obtained from the plurality of SAR cycles by a binary number 1 when the redistributed voltage is greater than a common mode reference voltage.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
   a high gain input stage configured as an integrator in a successive approximation register (SAR) analog-to-digital converter (ADC);
   a clamping and filtering stage configured to clamp a voltage on a high impedance node to a predetermined level approximately equal to a diode voltage drop in a clamping mode of an SAR cycle; and
   a decision-making stage connected to an output of the clamping and filtering stage.

2. The apparatus of claim 1, wherein the high gain input stage comprises:
   a first transistor configured as a current source;
   a differential pair comprising a second transistor and a third transistor;
   a first gain stage leg comprising a first current source, a fourth transistor and a fifth transistor connected in series between a bias voltage bus and ground;
   a second gain stage leg comprising a second current source, a sixth transistor and a seventh transistor connected in series between the bias voltage bus and ground; and
   a first auxiliary switch and a second auxiliary switch connected in series between a common node of the first current source and the fourth transistor, and a common node of the second current source and the sixth transistor, wherein gates of the fifth transistor and the seventh transistor are connected together, and further connected to a common node of the first auxiliary switch and the second auxiliary switch.

3. The apparatus of claim 1, wherein the clamping and filtering stage comprises:
   a third auxiliary switch and a capacitor connected in series between the common node of the first current source and the fourth transistor, and ground;
   a fourth auxiliary switch connected between the common node of the second current source and the sixth transistor, and a common node of the third auxiliary switch and the capacitor;
   a third current source and an eighth transistor connected in series between the bias voltage bus and ground; and
   a fifth auxiliary switch connected between a drain of the eighth transistor and a gate of the eighth transistor.

4. The apparatus of claim 1, wherein the decision-making stage comprises:
   a sixth auxiliary switch and a seventh auxiliary switch connected in series between a common node of the third current source and the eighth transistor, and ground; and
   an amplifier having an input connected to a common node of the sixth auxiliary switch and the seventh auxiliary switch.

5. The apparatus of claim 1, wherein:
   the high gain input stage, the clamping and filtering stage and the decision-making stage are connected in cascade between an SAR voltage bus and an output of the SAR ADC.

6. The apparatus of claim 5, further comprising:
   a binary-weighted capacitor array, wherein each capacitor of the binary-weighted capacitor array has a first terminal connected to the SAR voltage bus, and a second terminal coupled to an input voltage bus, a reference voltage bus and a ground voltage bus through a single pole triple throw switch.

7. The apparatus of claim 5, further comprising:
   an error correction stage comprising an adjustable capacitor, wherein the adjustable capacitor is configured to perform a linear correction on a result obtained from a plurality of SAR cycles.

8. A method comprising:
   configuring an analog-to-digital converter (ADC) to convert an analog signal into a digital signal, the ADC comprising a capacitive digital-to-analog stage, an error correction stage, a switch array, a high gain input stage, a clamping and filtering stage and a decision-making stage;
   in a clamping mode of a successive approximation register (SAR) cycle, clamping a voltage on a high impedance node to a predetermined level approximately equal to a diode voltage drop, resetting the decision-making stage, and isolating the decision-making stage from the high gain input stage and the clamping and filtering stage; and
   in a comparison mode of the SAR cycle, connecting the decision-making stage to the high gain input stage and the clamping and filtering stage, and amplifying, by the high gain input stage, the clamping and filtering stage and the decision-making stage, a difference of the analog signal and an output of the capacitive digital-to-analog stage to generate an output of the ADC.

9. The method of claim 8, wherein:
the high gain input stage comprises:
   a first transistor configured as a current source;
   a differential pair comprising a second transistor and a third transistor;
   a first gain stage leg comprising a first current source, a fourth transistor and a fifth transistor connected in series between a bias voltage bus and ground;
   a second gain stage leg comprising a second current source, a sixth transistor and a seventh transistor connected in series between the bias voltage bus and ground; and
   a first auxiliary switch and a second auxiliary switch connected in series between a common node of the first current source and the fourth transistor, and a common node of the second current source and the sixth transistor, wherein gates of the fifth transistor and the seventh transistor are connected together, and further connected to a common node of the first auxiliary switch and the second auxiliary switch;
the clamping and filtering stage comprises:
   a third auxiliary switch and a capacitor connected in series between the common node of the first current source and the fourth transistor, and ground;
   a fourth auxiliary switch connected between the common node of the second current source and the sixth transistor, and a common node of the third auxiliary switch and the capacitor;
   a third current source and an eighth transistor connected in series between the bias voltage bus and ground; and
   a fifth auxiliary switch connected between a drain of the eighth transistor and a gate of the eighth transistor; and
the decision-making stage comprises:
   a sixth auxiliary switch and a seventh auxiliary switch connected in series between a common node of the third current source and the eighth transistor, and ground; and
   an amplifier having an input connected to a common node of the sixth auxiliary switch and the seventh auxiliary switch.

10. The method of claim 9, further comprising:
in an auto-zeroing mode, configuring the high gain input stage as a closed loop unity gain amplifier; and
configuring the switch array to store an input offset of the high gain input stage on an input bus connected to the high gain input stage, wherein in the auto-zeroing mode, the first switch, the fourth switch, the fifth switch and the sixth switch are turned off, and the second switch, the third switch and the seventh switch are turned on.

11. The method of claim 9, further comprising:
in the clamping mode of the SAR cycle, configuring the high gain input stage as an integrator to filter noise; and
configuring the clamping and filtering stage to clamp the voltage on the high impedance node to the predetermined level approximately equal to the diode voltage drop, wherein in the clamping mode, the first switch, the fourth switch, the fifth switch and the seventh switch are turned on, and the second switch, the third switch and the sixth switch are turned off.

12. The method of claim 9, wherein:
the common node of the second current source and the sixth transistor is the high impedance node.

13. The method of claim 9, further comprising:
in the comparison mode of the SAR cycle, configuring the high gain input stage as a first amplifier gain stage;
configuring the clamping and filtering stage as a second amplifier gain stage; and
configuring the decision-making stage as a third amplifier gain stage, wherein:
   the first amplifier gain stage, the second amplifier gain stage and the third amplifier gain stage are connected in cascade; and
   in the comparison mode, the first switch, the fourth switch and the sixth switch are turned on, and the second switch, the third switch, the fifth switch and the seventh switch are turned off.

14. The method of claim 8, further comprising:
receiving the analog signal, a reference voltage and a ground voltage;
sampling the analog signal on a binary-weighted capacitor array;
connecting a most significant bit (MSB) capacitor of the binary-weighted capacitor array to the reference voltage, and connecting other capacitors of the binary-weighted capacitor array to the ground voltage;
determining an MSB based on a comparison between the analog signal and one half of the reference voltage; and
for subsequent SAR cycles, connecting the MSB capacitor to the reference voltage when the MSB is determined to be a logic high bit, and connecting the MSB capacitor to the ground voltage when the MSB is determined to be a logic low bit.

15. The method of claim 8, further comprising:
after a plurality of SAR cycles, determining a least significant bit (LSB); and
after determining the LSB, performing a linear correction on a result obtained from the plurality of SAR cycles.

16. The method of claim 15, further comprising:
connecting an adjustable capacitor of the error correction stage to the reference voltage;
redistributing the reference voltage between the adjustable capacitor and a binary-weighted capacitor array to obtain a redistributed voltage on a common node of the adjustable capacitor and the binary-weighted capacitor array; and
incrementing the result obtained from the plurality of SAR cycles by a binary number 1 when the redistributed voltage is less than a common mode reference voltage.

17. The method of claim 15, further comprising:
connecting an adjustable capacitor of the error correction stage to the reference voltage;
redistributing the reference voltage between the adjustable capacitor and a binary-weighted capacitor array to obtain a redistributed voltage on a common node of the adjustable capacitor and the binary-weighted capacitor array; and
decreasing the result obtained from the plurality of SAR cycles by a binary number 1 when the redistributed voltage is greater than a common mode reference voltage.

18. An ADC comprising:
a binary-weighted capacitor array configured as a capacitive digital-to-analog stage coupled between an SAR bus and three voltage buses including an input voltage bus, a reference voltage bus and a ground voltage bus;
an error correction stage connected to the SAR bus, wherein the error correction stage is configured to perform a linear correction on a result obtained from a plurality of successive approximation register cycles applied to the capacitive digital-to-analog stage;
a high gain input stage having an input connected to the SAR bus;
a clamping and filtering stage connected to an output of the high gain input stage, wherein the clamping and filtering stage is configured to clamp a voltage on a high impedance node to a predetermined level approximately equal to a diode voltage drop in a clamping mode of an SAR cycle; and
a decision-making stage connected to an output of the clamping and filtering stage.

19. The ADC of claim 18, wherein:
each capacitor of the binary-weighted capacitor array has a first terminal connected to the SAR bus, and a second terminal coupled to the input voltage bus, the reference voltage bus and the ground voltage bus through a single pole triple throw switch.

20. The ADC of claim 18, wherein:
the high gain input stage comprises:
  a first transistor configured as a current source;
  a differential pair comprising a second transistor and a third transistor;
  a first gain stage leg comprising a first current source, a fourth transistor and a fifth transistor connected in series between a bias voltage bus and ground;
  a second gain stage leg comprising a second current source, a sixth transistor and a seventh transistor connected in series between the bias voltage bus and ground; and
  a first auxiliary switch and a second auxiliary switch connected in series between a common node of the first current source and the fourth transistor, and a common node of the second current source and the sixth transistor, wherein gates of the fifth transistor and the seventh transistor are connected together, and further connected to a common node of the first auxiliary switch and the second auxiliary switch;
the clamping and filtering stage comprises:
  a third auxiliary switch and a capacitor connected in series between the common node of the first current source and the fourth transistor, and ground;
  a fourth auxiliary switch connected between the common node of the second current source and the sixth transistor, and a common node of the third auxiliary switch and the capacitor;
  a third current source and an eighth transistor connected in series between the bias voltage bus and ground; and
  a fifth auxiliary switch connected between a drain of the eighth transistor and a gate of the eighth transistor; and
the decision-making stage comprises:
  a sixth auxiliary switch and a seventh auxiliary switch connected in series between a common node of the third current source and the eighth transistor, and ground; and
  an amplifier having an input connected to a common node of the sixth auxiliary switch and the seventh auxiliary switch.

* * * * *